US007982161B2

(12) United States Patent
Sun et al.

(10) Patent No.: US 7,982,161 B2
(45) Date of Patent: Jul. 19, 2011

(54) METHOD AND APPARATUS FOR LASER DRILLING HOLES WITH TAILORED LASER PULSES

(75) Inventors: Yunlong Sun, Beaverton, OR (US); Weisheng Lei, Portland, OR (US); Hisashi Matsumoto, Hillsboro, OR (US); Brian Johansen, Hillsboro, OR (US); Gregg Hardy, Portland, OR (US); Brian Baird, Oregon City, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 717 days.

(21) Appl. No.: 12/054,115

(22) Filed: Mar. 24, 2008

(65) Prior Publication Data
US 2009/0236323 A1    Sep. 24, 2009

(51) Int. Cl.
*B23K 26/38* (2006.01)

(52) U.S. Cl. ................ 219/121.7; 219/121.71

(58) Field of Classification Search .......... 219/121.61, 219/121.67–121.72, 121.85
See application file for complete search history.

(56) References Cited

U.S. PATENT DOCUMENTS

| | | | | |
|---|---|---|---|---|
| 5,369,659 A | * | 11/1994 | Furumoto et al. | 372/50.23 |
| 5,574,810 A | * | 11/1996 | Byron et al. | 385/37 |
| 2001/0009250 A1 | * | 7/2001 | Herman et al. | 219/121.69 |
| 2002/0185474 A1 | * | 12/2002 | Dunsky et al. | 219/121.7 |

* cited by examiner

*Primary Examiner* — Samuel M Heinrich
(74) *Attorney, Agent, or Firm* — Patrick F Leonard (57) ABSTRACT

An improved method and apparatus for drilling vias in electronic substrates with laser pulses is presented which uses one or more tailored pulses to reduce debris remaining in the via while maintaining system throughput and avoiding damage to the substrate. A tailored pulse is a laser pulse that features a power spike having a peak power 10% higher than the average power of the pulse and lasting less than 50% of the duration of the pulse. Methods and apparatuses for creating tailored pulses by slicing longer duration pulses are shown.

20 Claims, 7 Drawing Sheets

METHOD AND APPARATUS FOR LASER DRILLING HOLES WITH TAILORED LASER PULSES

TECHNICAL FIELD

The present invention relates to laser processing a workpiece. More particularly, it relates to a method and apparatus for laser drilling holes in multilayer electronic substrates or boards for the purpose of forming vias to permit electrical interconnections between the layers using pulses from a $CO_2$ laser. Specifically, it relates to laser drilling holes in a workpiece with tailored pulses created from a longer duration pulse using pulse slicing techniques.

BACKGROUND OF THE INVENTION

Nearly all currently manufactured electronic products, including devices such as computers, cell phones and other consumer electronics, are constructed by attaching electronic components to substrates or boards (hereafter as substrates). Electronic components include integrated circuits, discreet active and passive devices, displays and connectors. Substrates function to hold the electronic components in place and provide electrical connections between the components with desired mechanical, thermal and electrical properties. Substrates typically include a non-conductive layer or layers combined with conductive elements that function electrically in cooperation with the electronic components. Materials which form the non-conductive layers can include crystalline materials such as silicon or sapphire, amorphous materials such as non-crystalline silicon or glass, sintered ceramic materials such as aluminum oxide, or organic materials such as FR-4, polyimide, or ABF, or combinations of the preceding. Conductors are formed on or in the substrate by processes including photolithographically depositing conductive materials such as polysilicon, aluminum or copper, depositing conductive inks using screen print or ink jet technologies, or laminating and/or patterning conductive layers on or in the substrate.

Figure 1:
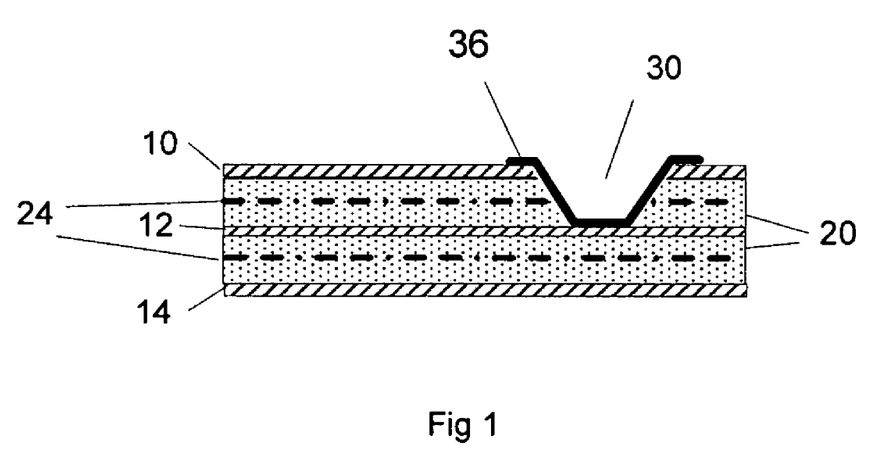
FIG. 1 is a sectional view of a multilayer workpiece.

What these processes have in common is the need to interconnect conductors which may be separated by layers of insulating or nonconductive material. Electronic substrates are typically made up of conductive and nonconductive layers arranged in a planar fashion. FIG. 1 shows a schematic diagram of a multilayer substrate made up of conductive or inorganic layers 10, 12 and 14, separated by insulating or organic layers 20, which may contain one or more reinforcing layers 24. FIG. 1 also shows a via 30 drilled into the substrate with conductive plating 36 forming an electrical connection between conductive layers 10 and 12.

Figure 2:
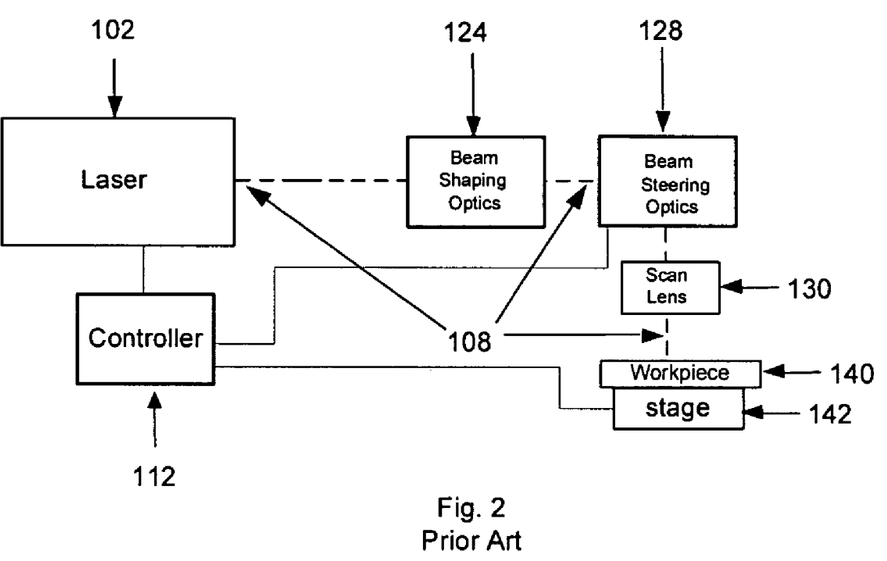
FIG. 2 is a schematic diagram showing prior art laser drilling system

FIG. 2 shows a schematic diagram of a prior art laser drilling system. Laser drilling systems typically comprise a laser 102 emitting laser pulses along a laser beam path 108, beam shaping optics 124, beam steering optics 128, scan lens 130, a controller 112, and a stage 142 with motion control devices (not shown) for holding the workpiece 140 and moving it in up to six axes which include translation in three orthogonal axes (X, Y and Z) and rotation about the three axes (rho, phi and theta). The controller 112 directs the laser 102 to emit energy and then coordinates the motions of the beam steering optics and the stage to position the workpiece in the appropriate place at the appropriate time. The performance of a laser via drilling system is evaluated according to criteria including throughput and via quality. Factors that determine via quality include correct location, shape, and absence of debris. Debris is defined as material that should have been removed being left in the via or material re-deposited in the via after being previously removed by the laser drill. Drilling high quality vias with little or no debris is highly desirable because it allows good mechanical contact between the conductor and the bottom of the via and the side walls. Providing a good, textured surface of the conductive layer at the bottom of the via, free of debris or remaining organic "smear" enables good electrical contact between the bottom conductor and the plating, further improving the via quality. At the same time, it is desirable to maintain as high a system throughput as possible, meaning that as little time as possible should be taken to drill a via. Via are typically drilled using pulsed laser output. For a given pulse repetition rate, this usually means drilling the via with as few pulses as possible consistent with desired quality. And finally, it is desirable to deliver a system and method to accomplish the above at a reasonable cost and complexity.

Figure 3:
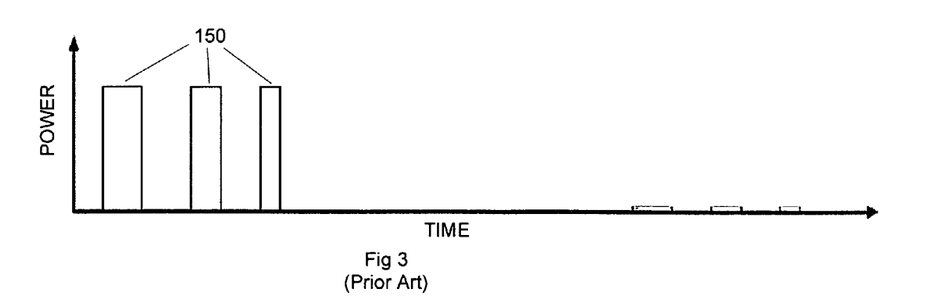
FIG. 3 shows prior art laser pulses

U.S. Pat. No. 6,479,788 of Arai, et. al, assigned to Hitachi Via Mechanics, Ltd. has a stated purpose of solving this problem by slicing out a series of laser pulses with decreasing pulse width of what appear to be substantially square pulses out from a $CO_2$ laser pulse of a long pulse duration. Slicing out a series of pulses with increasingly shorter pulses out from a laser pulse with a long pulse width as is disclosed in the '788 patent is an attempt to increase the power available to micromachine the substrate while limiting unwanted thermal effects of the laser processing with long pulse width laser pulse. FIG. 3 shows exemplary laser pulses 150 of this type. However, since all the pulses have substantially the same constant peak power and square shape during the process of via drilling, it fails to address the issue of using an optimized laser pulse power profile or intensity profile to ensure the best processing results in different stages of the via drill, such as volume material rejection at the beginning of drilling and delicate cleaning of the via bottom cleaning at the end of the via drill.

Accordingly, there is a continuing need for an apparatus for laser drilling vias in electronic assemblies, capable of forming relatively debris-free, high quality vias while avoiding damage to the substrate or its surrounding structure material and maintaining acceptable system throughput.

SUMMARY OF THE INVENTION

An object of the present invention is, therefore, to provide a method and apparatus in the form of a laser processing system with improved ability to micromachine high quality vias in workpieces comprising electronic substrates. To achieve the foregoing and other objects in accordance with the purposes of the present invention, as embodied and broadly described herein, a method and apparatus is disclosed.

In one embodiment via quality is improved by specifically tailoring the $CO_2$ laser pulse into one with a power spike occurring at a certain time during the laser pulse at the beginning of the via formation. This tailored pulse with a spike is effective in explosively ejecting volume material out of the via site at high speed, so less debris will be formed around the area of the via, or less re-deposition back to the wall inside of the via. This tailored pulse shape will also allow the pulse rate to be increased over the rate used with prior art pulses, since the explosive ejection caused by the tailored pulse disperses the laser induced plume or plasma much faster than prior art pulses, allowing the next laser pulse to be fired at the substrate more quickly without forming debris. This is because the plume or plasma absorbs laser energy, resulting in an undesired heating effect on the via structure. The fact that the plasma absorbs laser energy preventing it from reaching the substrate will also reduce the via formation throughput. A high rate of energy coupling helps reduce smear, since it works to couple energy rapidly into the organic material attached to the metallic conductor and hence remove it before the metal can conduct the energy away in the form of heat. At a later stage of via drilling, laser pulse or pulses with different power profile can be used, such as one with a Gaussian shape and optimized peak power which is not necessarily the same as that of the pulses used in the other stages of the via drill to ensure that the bottom of the via will be cleaned out without having damage caused by smear, or delamination (separation of the conducting material and insulating material around the bottom area). The total laser energy applied to the substrate must be controlled to prevent damage to the surrounding material or the metallic conductor at the bottom of the via. This is accomplished by controlling the tailored pulse shape and the total numbers of tailored and non-tailored pulses.

A tailored pulse is defined as a laser pulse which has a leading edge, a falling edge and at least one power spike in between. Some examples of tailored pulses of this type are shown schematically in FIGS. 4 and 5. These figures graph instantaneous laser power vs. time. Tailored pulses 160, 180 are characterized by a leading edge 162, 182 a falling edge 164, 184 and power spikes 166, 186. These power spikes serve to rapidly couple energy into the material to be removed without increasing the total energy delivered to the substrate beyond a point where damage would occur.

Tailored pulses are characterized by one or more power spikes occurring during the pulse duration. A power spike is characterized by having a peak power which is greater than the average power of the pulse. Furthermore, the power spike is characterized by having a duration which is less than the duration of the entire pulse. Power spikes with peak power greater than 10% to 100% of the average power of the pulse, or more preferably between 10% and 30% of the average power of the pulse. Preferred power spikes have duration of less than about 25% to about 75% of the duration of the pulse, more preferably with a duration of about 35% of the duration of the entire pulse.

Figure 4:
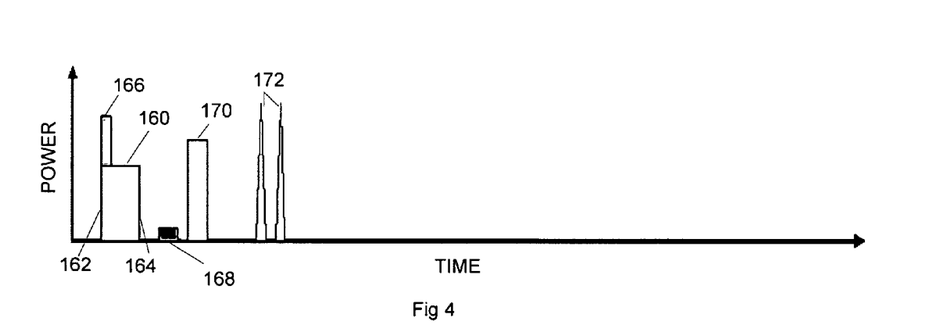
FIG. 4 shows tailored pulses, incubation pulses and non-tailored pulses for via drilling FIG. 5. shows tailored pulses, incubation pulses and non-tailored pulses for via drilling
Figure 5:
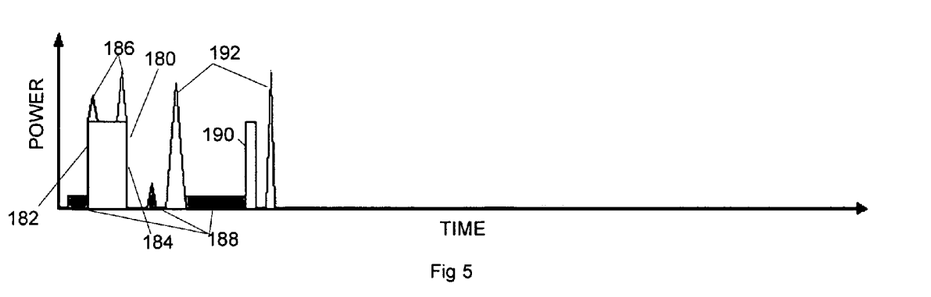

Differences between the pulses shown in FIGS. 4 and 5 concern the placement of the power spike within the pulse. In FIG. 4, the spike 166 occurs near the leading edge of the pulse. With this type of pulse, the power spike 166 initiates explosive removal of material while the remainder of the pulse continues the material removal without introducing enough energy to damage the substrate. In FIG. 5, the spikes 186 occur near the leading edge of the pulse and then later in the pulse, near the falling edge. The idea is that a final, explosive ejection of material will occur near the end of the pulse, thereby further clearing material from the via. Selection of tailored pulse parameters include the pulse temporary shape (intensity profile), the peak pulse power of the spike, the average pulse power, rise time, fall time, temporal pulse width, interval time between the tailored pulses and total number of the tailored pulses, etc. Some systems are able to adjust the laser spot size and spatial profile. Pulse fluences in the range from 0.1 Joules/cm$^2$ to about 100 Joules/cm$^2$ per pulse, or more preferably from 1.0 Joules/cm$^2$ to about 10 Joules/cm$^2$ per pulse are effective in drilling vias according to the methods described herein. Pulse duration is also an important parameter to be selected. Pulse duration can range from about several picoseconds to greater than several hundred microseconds, or more preferably in the range from one nanosecond (ns) to a few hundred microseconds.

FIGS. 4 and 5 show tailored pulses 160 and 180 used together with non-tailored pulses 170, 172, 190 and 192 to form vias. FIG. 4 shows a tailored pulse 160 with a single power spike 166 followed by a rectangular pulse 170 and then two Gaussian pulses 172. FIG. 5 shows a tailored pulse 172 with two power spikes followed by a Gaussian pulse 192, a rectangular pulse 190 and another Gaussian pulse 192.

FIGS. 4 and 5 also show the use of incubation pulses 168 188 before and after tailored pulses 160, 180 and non-tailored pulses 170, 190, and 192. These pulses serve to pre-heat the material to enable the succeeding pulses to more easily remove material. Pre-heating raises the temperature of the material without causing damage to the surrounding substrate. Pre-heat pulses are below the threshold that would permit material removal. The subsequent tailored or non-tailored pulses can then begin removing material more rapidly and with better quality since the material already has energy stored in it from the pre-heat pulses.

DETAILED DESCRIPTION OF PREFERRED EMBODIMENTS

Efficiently drilling high-quality vias involves removing substantially all insulating material from the via volume with the fewest laser pulses while avoiding damage to the surrounding substrate. This can be accomplished by drilling a via with one or more tailored pulses possibly in combination with incubation pulses and non-tailored pulses as described herein. Three measurements of pulses are relevant to via drilling. The first is peak power, expressed in Watts, which measures the highest instantaneous power reached during the pulse duration. The second is energy, which is calculated by integrating power over the duration of the pulse. When the beam spot size is included into the consideration, term of fluence is more often used which is in a unit of Joules/cm$^2$, The third one is the profile of the power. It is the rate of how fast the laser energy is applied to the via site versus time.

Maximum laser pulse fluence is determined by the damage threshold of the substrate being drilled. Too high a fluence can damage the surrounding substrate. Damage to the surrounding substrate can take the form of delamination of layers adjacent to the via, or damage to the exposed conductor at the bottom of the via. Another form of damage is undercut, where unwanted material is removed from the via. Undercut typically causes the bottom of the via to have a larger diameter than the top diameter, resulting in a via with negative taper, which inhibits plating of the via. Undercut can be caused by a too high a fluence being used to drill the via. Use of tailored pulses can mitigate these sources of damage by providing sufficient power to clear material from the via while minimizing the fluence used.

Within the limits of total pulse fluence determined by avoiding substrate damage, material removal is a function of pulse peak power, as well as the power profile or pulse shape. A right combination of a higher peak power and desired power profile couple energy into the substrate material before it can be dissipated in the form of thermal diffusion, thereby concentrating energy in a given volume and ejects out from the via site the material to be removed explosively at a higher speed Explosively ejected material is less likely to be redeposited in the via volume as it cools, thereby promoting a cleaner, more debris-free via. When the drill gets to the via bottom area, the major issue has to dealt with is no longer a larger material volume to remove, rather it is a limited material volume but it is right next to the conducting layer which is acting as a heat sink. The desired laser pulse parameter is a spike like pulse shape with high enough peak power and narrow enough pulse width. This tends to eliminate insulator smear on the conductive material on the bottom of the via. Too low a fluence and the smear remains. Too high a fluence and the conductor or the bottom of the insulating material will become damaged. Rapid coupling of energy into the insulating material with desired rate and profile is effective in removing insulating material without damaging the bottom structure of the via.

In order to precisely characterize tailored pulses, a method of representing and measuring pulses must be determined. One method of characterizing a laser pulse is to graph the instantaneous power level of the pulse versus time, also known as the power profile. Examples of these types of graphs are shown in FIGS. 4 and 5. A laser pulse so graphed has a beginning, an end and duration. A way to define pulse duration is to define the beginning of a pulse, or rising edge 162, 182 as the point in time where the power of a pulse rises from substantially zero to a non-zero value. The pulse will remain above this level until the end of the pulse, defined as the falling edge 164, 184 where the pulse power again returns to substantially zero. Duration is then defined as the time between these points. This is in contrast to the full width at half maximum (FWHM) method typically used to measure relatively simply shaped pulses, such as those with substantially Gaussian shape, For more complex pulse shapes, the FWHM measure does not provide a meaningful characterization. In particular, FWHM can drastically misrepresent the pulse duration when applied to tailored pulses and does not correlate to other important factors when assessing pulse parameters to use in forming vias.

Another measure of pulse duration for complex pulse shapes such as tailored pulses results form the time integrated square ($T_{IS}$) method. This method is related to the second moment or standard error measure in statistics. The duration is calculated by the equation:

$$T_{is} = \frac{\left(\int I(t)dt\right)^2}{\int I^2(t)dt}$$

Where I(t) is the power intensity of the pulse as a function of time. Either of the two recommended methods of measuring pulse duration, graphically or by $T_{IS}$ will yield a more accurate measure of complex pulse duration than the FWHM measure.

In the instant invention, via quality is controlled by adjusting laser pulse shape to yield the desired result. In the case where a blind via is being drilled through insulating material to reach a non-organic layer within the substrate, debris within the via comes from two main sources. The first is insulating material left on the metallic conductor after drilling, also called "smear". Smear results because it is more difficult to remove insulating material from the bottom of the via than from the volume of the via since the metallic compounds conduct heat away from the drilling site. This means that as the metallic conductor begins to be exposed, it requires more energy to remove remaining material from the conductor. The energy cannot simply be increased, since too much energy delivered to the metallic conductor will initially melt the surface of the metallic conductor, rendering it smooth and therefore less able to bond mechanically with the subsequent plating. Given enough energy in the pulse the conductive material will eventually be removed, thus defeating the purpose of drilling the via.

Tailored laser pulses as described herein mitigate the dielectric smear problems by providing a brief, high power pulse of energy to the material. This serves to couple the energy into the material before it has a chance to propagate to the metallic conductor, where it will be rapidly dissipated. It is this rapid dissipation of energy by the metallic conductor that reduces the ability of the laser to remove the material. By coupling more energy per unit time into the material to be removed, the temperature of the material in the immediate vicinity of the laser spot is increased thereby promoting its removal by either ablation, where the material is turned directly into a plasma, or by a thermal process wherein the material is vaporized or boiled off as it passes from a liquid to a gas. The portion of the pulse that is not contained in the power spike contributes to this process, while keeping the total energy below the level that would cause damage to the substrate.

Another source of debris in a drilled via is organic material re-deposited on the side walls of the via. This re-deposit is caused by organic material being either vaporized or liquefied or converted to a plasma by the laser pulse but not fully ejected from the via. This cloud of plasma/vaporized/liquefied material is sometime referred to as a "plume". As the via wall cools, this plasma, liquefied or vaporized material is re-deposited on the via wall where it forms a layer and distorts the taper of the side wall, which makes it more difficult for the subsequently plated material to adhere to the sidewall. Tailored pulses mitigate this type of debris collection by explosively ejecting material from the via volume as it is ionized, melted or vaporized by the pulse. The explosive ejection of material is directly related to the peak power of the pulse used. The high peak power concentrates energy in a volume of material before it can diffuse or propagate away from the volume thermally. This temporary, localized heating is responsible for the forceful ejection of material from the via, thus mitigating debris caused by redeposit of material on the surfaces of the via.

Another desirable feature of tailored pulses is that they achieve the above noted results while minimizing the total energy of the pulse. By adding a power spike to a conventional pulse, the total energy of the pulse is less than if the peak power of the entire pulse was raised to the desired level. This minimization of total energy prevents damage to the via or the surrounding substrate. The first type of damage to consider is morphological damage to the via. Too much energy during drilling can cause the via to become undercut, wherein the bottom of the via is larger than the top. This causes problems with subsequent plating steps since it is difficult to get the plating material to flow properly into a hole with negative taper. The second type of damage attributable to excess energy is delamination of layers on or within the substrate adjacent to the area being drilled due to excess heat breaking down the bond between the layers. This is typically seen on the conductors bonded to the surface of the substrate adjacent to or surrounding the via. Inner conductor layers can also delaminate by the same process. Tailored pulses mitigate both of these types of damage by controlling the total energy.

Figure 6:
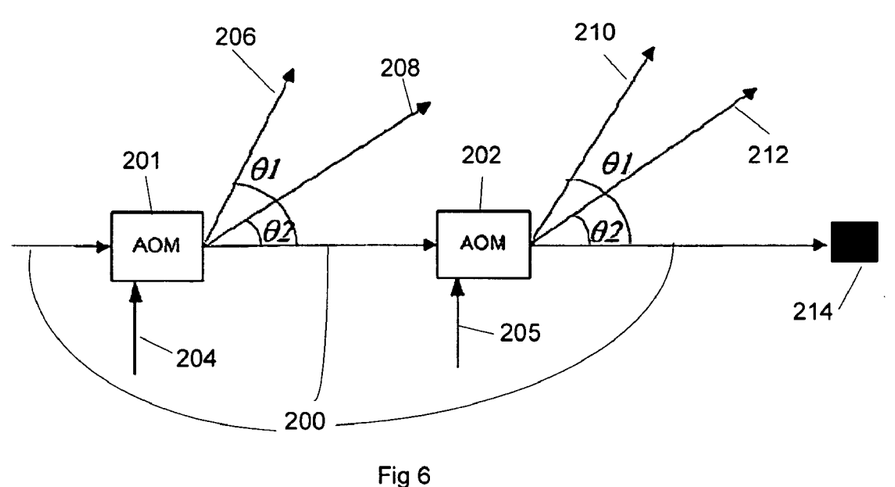
FIG. 6 is a schematic diagram showing a multi-beam pulse tailoring device

In one embodiment, tailored pulses can also be constructed from long duration pulses typically produced by lasers used in micromachining applications. An exemplary laser which can be used in this application is a Diamond E-400 liquid-cooled RF excited $CO_2$ laser, manufactured by Coherent, Inc., Santa Clara, Calif. FIG. 6 shows a schematic diagram of components that create tailored pulses from long duration pulses. FIG. 6 shows a laser beam 200 entering a first dual-direction beam deflecting device 201. This device 201 can deflect an incoming laser beam 200 depending upon radio frequency (RF) input 204. In this example, RF input 204 can be off, in which case the laser beam continues unchanged through the beam deflector 201, or set to one of two frequencies. When RF input 204 is set to a first frequency, a part of the laser beam 200 will be deflected at angle θ1 206. When the RF input 204 is set to a second frequency, a part of the laser beam 200 will be deflected at angle θ2 208. Likewise, beam deflecting device 202, under direction of RF input 205, can deflect a part of input laser beam 200 at either one or two angles, θ1 210 or θ2 212. If no frequency is input to device 202, the laser beam 200 continues onto beam dump 214. Note that these devices can deflect laser beams at a wide variety of angles depending upon the frequency input. Two deflection angles were chosen only as an illustration. Also, these devices are capable of deflecting a portion of the input beam power at any given moment depending upon the amplitude of the RF signal input to the device 201, 202. The percentage of the power of the input beam 200 deflected varies monotonically with the signal strength of the RF signal up to a maximum, where 80% or higher percentage of the beam is deflected. A variety of technologies can be used as beam deflecting devices. In one embodiment, acousto-optic deflectors (AODs) are used to deflect the laser beam in one or more directions. In this case, the amplitude of the selected frequency input to the device determines how much of the input laser beam is deflected at any given moment. This allows an arbitrary waveform to be emitted by the controlling electronics to the AOD which then reproduces the waveform in deflected laser beam power. Electro-optic deflectors (EOD) in conjunction with other optical elements such as polarizers could also be used to achieve the same effects with faster response time of shorter than 1 nanosecond; the capability will be applicable for achieving a fast change rate in the tailored pulse profile variation.

Figure 7A:
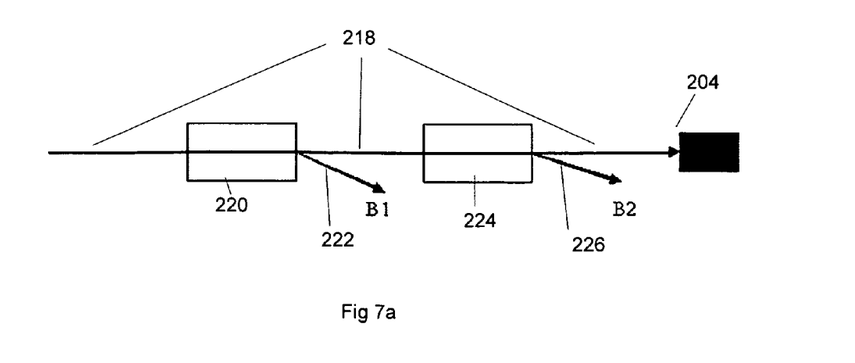
FIG. 7a is a schematic diagram showing a multi-beam pulse tailoring device.
Figure 7B:
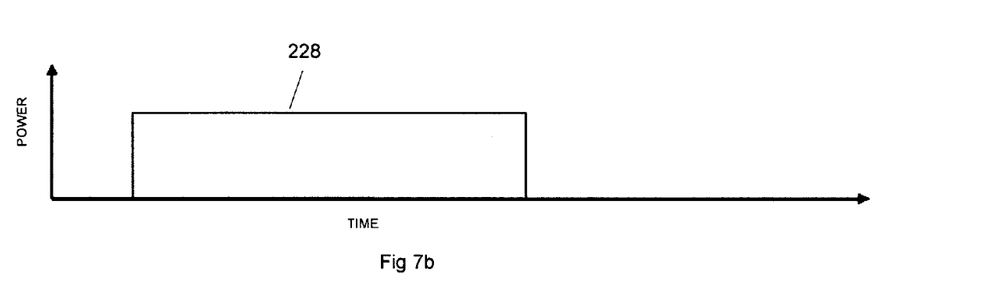
FIG. 7b shows a waveform for a pulse to be input to a pulse tailoring device.
Figure 7C:
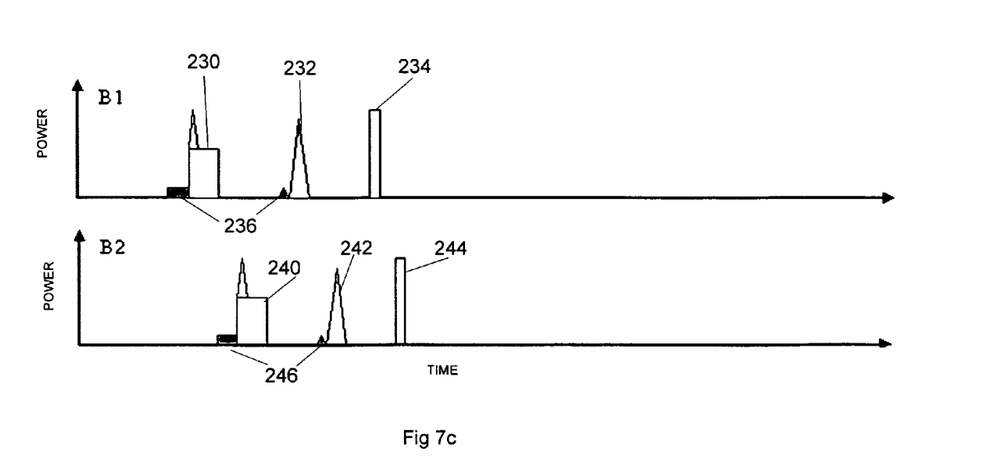
FIG. 7c shows waveforms for pulses output from a pulse tailoring device.

FIG. 7a shows an exemplary device to create two tailored pulse laser beams from a single laser beam input. FIG. 7a shows two single-deflecting beam deflection devices 220, 224, with input laser beam 218 and deflected outputs paths 222, 226 and transmitted original laser beam 218 ending at a beam dump 204. The deflected beams are labeled "B1" and "B2". FIG. 7b shows the pulse shape 228 input along laser beam 218 to the first deflection device 220. First deflection device can deflect a portion of the laser beam along path 222, labeled "B1", or transmit the laser beam 108 to second beam deflection device 224. Likewise, beam deflector device 226 can deflect a portion of input beam 218 along beam output path 226, labeled "B2", or allow it to continue to beam dump 204. FIG. 7c shows an exemplary result of this process. The upper graph, labeled "B1" shows the laser pulses output along beam path 222. As shown here, the first beam deflection device 220 has caused portions of the long duration input pulse 228 to be deflected so as to form the pulses 230, 232 and 234. Likewise, the second beam deflection device 224 deflects the input laser beam to form the pulses 240, 242 and 244 along output beam path 226. Note that as the dotted lines between the graphs suggest, the two deflection devices 220 and 224 can alternatively deflecting the input beam 228 into two sets of different or identical tailored pulses for multiple site via drill.

Figure 8:
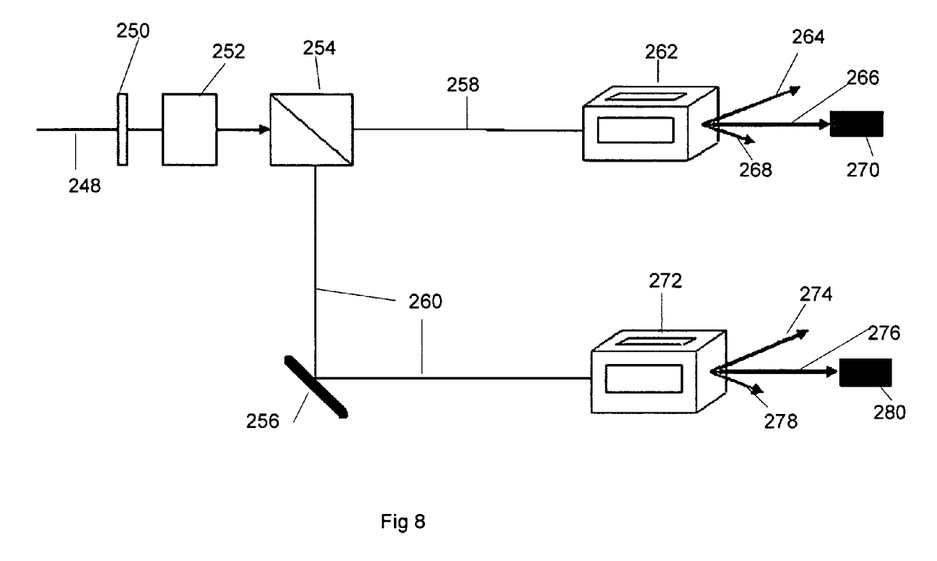
FIG. 8 shows multi-beam pulse tailoring device comprising an EOM and AOMs
Figure 9:
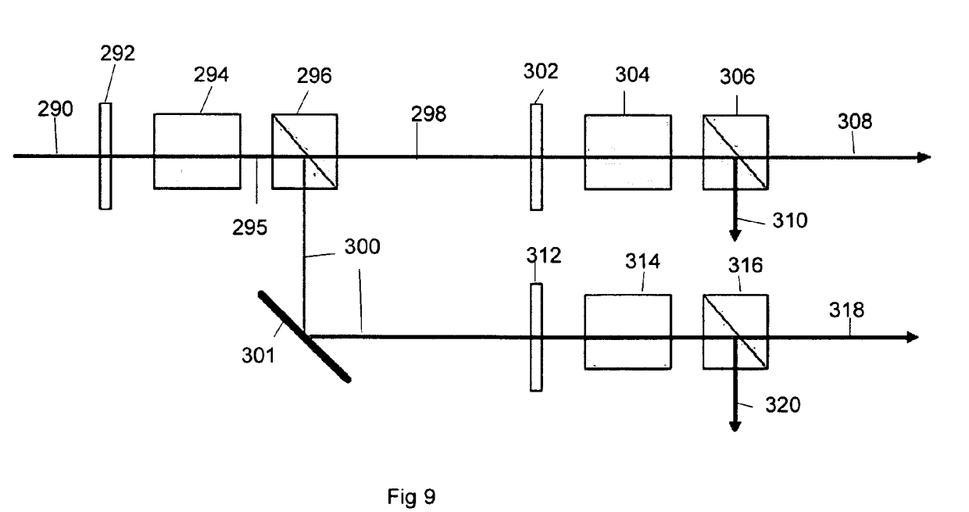
FIG. 9 shows multi-beam pulse tailoring device comprising EOMs

In another embodiment of the instant invention shown in FIG. 8, a laser beam, 248 is directed to a waveplate 250 which prepares the polarization of the laser beam 248 so that an electro optic modulator (EOM) 252 can cause the polarization angle of the laser beam to be programmable depending upon the input to the EOM 252 from a controller (not shown). The laser beam then passes through a polarizing beam splitter 254 that divides the input laser beam 248 into divided beams 258, 260. The power from laser beam 248 will be divided between beams 258 and 260, ranging from substantially 100% of the power in laser beam 258 to substantially 100% of the power in laser beam 260, depending upon the polarization angle FIG. 9 shows another embodiment of the instant invention which uses EOMs 304, 314 to tailor and/or deflect the laser beams 298, 300. In operation, a laser beam 290 is sent through a waveplate 292 to prepare it for processing by an EOM 294. The EOM 294 alters the polarization of the beam according to inputs from a controller (not shown). The altered beam 295 is then input to a polarized beam splitter 296 where the laser beam is divided between output beams 298, 300. The energy contained in the altered beam 295 is divided between output beams 298, 300 depending upon the polarization angle of the laser beam output from the EOM 294. Laser beam 298 passes through waveplate 302 which prepares the beam for processing by EOM 304 which rotates the polarization angle of the beam depending upon input from a controller (not shown). Polarized beam splitter 304 either passes a percentage of the laser beam power 308 or deflects it 310 depending upon the polarization angle, therefore a laser pulse traveling along laser beam path 308 can be programmed to assume a desired shape by inputting the appropriate signal to EOM 304. Note that either laser beam 308 or 310 can be programmed to be the desired pulse shape with this device, however, at the same time the desired pulse shape is output on one of the laser beam paths 308 or 310, the other laser beam path will convey a laser pulse with the power not used by the desired pulse and generally convey a pulse with an undesired pulse shape. This pulse will have to be either blocked or sent to a beam dump (not shown). In similar fashion, laser beam path 300 is redirected by optional turn mirror 301 and then sent through waveplate 312 to prepare the beam for processing by EOM 314, which programmably rotates the polarization angle of the beam 300 under direction of a controller (not shown). A polarized beam splitter 316 transmits 318 or deflects 320 the laser beam depending upon the polarization angle and thereby accomplishes pulse tailoring as above.

In operation, an embodiment of the instant invention as shown in FIG. 6, FIG. 7a, FIG. 8 or FIG. 9 could be combined with a prior art laser drill apparatus as shown in FIG. 2 to create a laser drill capable of delivering tailored pulses via one or more laser beams to one or more workpieces.

The preferred laser wavelengths are in the spectral range from about 150 nm to about 2000 nm, and include, but are not limited to from 9 micron to 10.6 microns, or its second harmonics from a $CO_2$ laser. Skilled persons will appreciate that lasers emitting output pulses at other suitable wavelengths are commercially available and could be employed. Harmonic conversion processes are described in V. G. Dmitriev, et al, *Handbook of Nonlinear Optical Crystals*, 138-141, Springer-Verlag, New York, 1991 ISBN 30540-53547-0.

It will be apparent to those of ordinary skill in the art that many changes may be made to the details of the above-described embodiments of this invention without departing from the underlying principles thereof. The scope of the present invention should, therefore, be determined only by the following claims.

We claim:

1. An improved method for forming a via in an electronic substrate having a layer of conductive material and a layer of insulating material, including the steps of producing a laser pulse with a laser, and directing said laser pulse to impinge upon said electronic substrate, said directed laser pulse defined by pulse parameters, the improvement comprising the further steps of:
    selecting at least one of said pulse parameters;
    producing with said laser at least one laser pulse consistent with said at least one selected pulse parameter,
    providing laser beam tailoring optics external to said laser to tailor said laser pulse,
    tailoring said laser pulse with said tailoring optics, and;
directing said at least one tailored laser pulse to remove insulating material from an intended volume of said electronic substrate defining said via, without causing substantial damage to said substrate in the vicinity of said via thereby drilling said via, wherein at least one said selected pulse parameter being application of at least one tailored pulse, said tailored pulse including at least one power spike characterized by a peak power greater than about 20% above the average power of the pulse with a duration less than about 50% of the duration of the pulse.

2. The method of claim 1 where said at least one selected pulse parameter being pulse width, said pulse width being between 1 and 100 ns.

3. The method of claim 1 where said at least one selected pulse parameter being pulse fluence, said fluence being between 1.0 and 10.0 J/cm2.

4. An improved method for forming a via in an electronic substrate having a layer of conductive material and a layer of insulating material, including the steps of producing a laser pulse with a laser, and directing said laser pulse to impinge upon said electronic substrate, said directed laser pulse defined by pulse parameters, the improvement comprising the further steps of:
    selecting at least one pulse parameter;
    producing with said laser in cooperation with said optics at least one laser pulse consistent with said at least one selected pulse parameter,
    providing laser beam tailoring optics external to said laser to tailor said laser pulse,
    tailoring said laser pulse with said tailoring optics, and;
directing said at least one tailored laser pulse to remove insulating material from an intended volume of said electronic substrate defining said via, without causing substantial damage to said substrate in the vicinity of said via thereby drilling said via, wherein said selected pulse parameters include at least one tailored pulse, said tailored pulse including at least one power spike characterized by a peak power greater than about 20% above the average power of the pulse with a duration less than about 50% of the duration of the pulse, said selected pulse parameters further include at least one incubation pulse, said incubation pulse having peak power less than 50% of the average power of said tailored pulse.

5. The method of claim 4 where said at least one selected pulse parameter being pulse width, said pulse width being between 1 and 100 ns.

6. The method of claim 4 where said at least one selected pulse parameter being pulse fluence, said fluence being between 0.1 and 10.0 J/cm2.

7. An improved system for forming vias in electronic substrates with at least one laser pulse, said system including a controller, a laser, said substrates having both conductive and insulating layers, and said laser pulses defined by pulse parameters, the improvements comprising:
    tailoring optics external to said laser operative to form tailored laser pulses, and;
    a controller operatively connected to said laser and said tailoring optics to produce at least one laser pulse consistent with said pulse parameters and direct them to said substrate, said at least one laser pulse operative to remove insulating material from an intended volume of said electronic substrate defining said via, wherein said at least one pulse parameter being at least one tailored pulse, said tailored pulse including at least one power spike characterized by a peak power greater than about 20% above the average power of the pulse with a duration less than about 50% of the duration of the pulse.

8. The method of claim 7 where said at least one pulse parameter being pulse width, said pulse width being between 1 and 100 ns.

9. The method of claim 7 where said at least one pulse parameter being pulse fluence, said fluence being between 0.1 and 10.0 J/cm2.

10. An improved system for forming vias in electronic substrates with at least one laser pulse, said system including a controller, and a laser, said substrates having both conductive and insulating layers, and said at least one laser pulse defined by pulse parameters, said improvements comprising:
    tailoring optics external to said laser operative to form tailored laser pulses, and;
    a controller operatively connected to said laser and said tailoring optics to produce at least one laser pulse consistent with said pulse parameters and direct them to said substrate, said at least one laser pulse operative to remove insulating material from an intended volume of said substrate defining said via, wherein said at least one pulse parameter includes at least one tailored pulse, said tailored pulse includes at least one power spike characterized by a peak power greater than about 20% above the average power of the pulse with a duration less than about 50% of the duration of the pulse, said at least one pulse parameter further includes at least one incubation pulse, said incubation pulse having peak power less than 50% of the average power of said tailored pulse.

11. The method of claim 10 where said at least one pulse parameter includes pulse width, said pulse width being between 1 and 100 ns.

12. The method of claim 10 where said at least one pulse parameter includes pulse fluence, said fluence being between 0.1 and 10.0 J/cm2.

13. The method of claim 1 where the tailoring optics include an AOM.

14. The method of claim 1 where the tailoring optics include an EOM.

15. The method of claim 4 where the tailoring optics include an AOM.

16. The method of claim 4 where the tailoring optics include an EOM.

17. The method of claim 7 where the tailoring optics include an AOM.

18. The method of claim 7 where the tailoring optics include an EOM.

19. The method of claim 10 where the tailoring optics include an AOM.

20. The method of claim 10 where the tailoring optics include an EOM.

* * * * *